(12) United States Patent
Lu et al.

(10) Patent No.: US 9,704,797 B2
(45) Date of Patent: Jul. 11, 2017

(54) WATERFALL WIRE BONDING

(75) Inventors: Zhong Lu, Shanghai (CN); Fen Yu, Shanghai (CN); Chin Tien Chiu, Taichung (CN); Cheeman Yu, Fremont, CA (US); Fuqiang Xiao, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/118,485

(22) PCT Filed: May 18, 2011

(86) PCT No.: PCT/CN2011/074234
§ 371 (c)(1),
(2), (4) Date: Mar. 13, 2014

(87) PCT Pub. No.: WO2012/155345
PCT Pub. Date: Nov. 22, 2012

(65) Prior Publication Data
US 2014/0183727 A1    Jul. 3, 2014

(51) Int. Cl.
*H01L 23/00* (2006.01)
*H01L 23/498* (2006.01)
(Continued)

(52) U.S. Cl.
CPC ...... *H01L 23/49866* (2013.01); *H01L 21/768* (2013.01); *H01L 23/49811* (2013.01); *H01L 24/48* (2013.01); *H01L 24/49* (2013.01); *H01L 24/85* (2013.01); *H01L 25/0657* (2013.01); *H01L 25/50* (2013.01); *H01L 24/03* (2013.01); *H01L 24/05* (2013.01); *H01L 24/45* (2013.01); *H01L 24/73* (2013.01); *H01L 24/78* (2013.01); *H01L 2224/03013* (2013.01); *H01L 2224/03614* (2013.01); *H01L 2224/04042* (2013.01); *H01L 2224/05026* (2013.01);
(Continued)

(58) Field of Classification Search
CPC ......... H01L 23/49866; H01L 23/49811; H01L 21/768
USPC ....................................... 257/737
See application file for complete search history.

(56) References Cited

U.S. PATENT DOCUMENTS 4,189,342 A    2/1980 Koek
4,970,365 A  * 11/1990 Chalco ............ 219/121.63
(Continued)

FOREIGN PATENT DOCUMENTS

CN    100481441    4/2009
EP      1017099    7/2000
(Continued)

OTHER PUBLICATIONS

English Abstract for CN1933148 published Apr. 22, 2009.
(Continued)

*Primary Examiner* — Christine Enad
(74) *Attorney, Agent, or Firm* — Vierra Magen Marcus LLP

(57) ABSTRACT

A wire bonded structure for a semiconductor device is disclosed. The wire bonded structure comprises a bonding pad; and a continuous length of wire mutually diffused with the bonding pad, the wire electrically coupling the bonding pad with a first electrical contact and a second electrical contact different from the first electrical contact.

11 Claims, 8 Drawing Sheets

(51) Int. Cl.
*H01L 25/065* (2006.01)
*H01L 25/00* (2006.01)
*H01L 21/768* (2006.01)

(52) U.S. Cl.
CPC .............. *H01L 2224/05124* (2013.01); *H01L 2224/05624* (2013.01); *H01L 2224/05644* (2013.01); *H01L 2224/05647* (2013.01); *H01L 2224/06145* (2013.01); *H01L 2224/06155* (2013.01); *H01L 2224/32145* (2013.01); *H01L 2224/32225* (2013.01); *H01L 2224/45015* (2013.01); *H01L 2224/45139* (2013.01); *H01L 2224/45144* (2013.01); *H01L 2224/45147* (2013.01); *H01L 2224/45164* (2013.01); *H01L 2224/45565* (2013.01); *H01L 2224/45664* (2013.01); *H01L 2224/4847* (2013.01); *H01L 2224/48091* (2013.01); *H01L 2224/48096* (2013.01); *H01L 2224/48145* (2013.01); *H01L 2224/48147* (2013.01); *H01L 2224/48227* (2013.01); *H01L 2224/48247* (2013.01); *H01L 2224/48456* (2013.01); *H01L 2224/48465* (2013.01); *H01L 2224/48471* (2013.01); *H01L 2224/48624* (2013.01); *H01L 2224/48644* (2013.01); *H01L 2224/48724* (2013.01); *H01L 2224/48824* (2013.01); *H01L 2224/48844* (2013.01); *H01L 2224/48847* (2013.01); *H01L 2224/49175* (2013.01); *H01L 2224/73265* (2013.01); *H01L 2224/78301* (2013.01); *H01L 2224/78349* (2013.01); *H01L 2224/85181* (2013.01); *H01L 2224/85186* (2013.01); *H01L 2224/85205* (2013.01); *H01L 2224/85399* (2013.01); *H01L 2224/85948* (2013.01); *H01L 2224/92247* (2013.01); *H01L 2225/0651* (2013.01); *H01L 2225/06506* (2013.01); *H01L 2225/06562* (2013.01); *H01L 2924/00014* (2013.01); *H01L 2924/01006* (2013.01); *H01L 2924/01013* (2013.01); *H01L 2924/01025* (2013.01); *H01L 2924/01029* (2013.01); *H01L 2924/01033* (2013.01); *H01L 2924/01047* (2013.01); *H01L 2924/01057* (2013.01); *H01L 2924/01079* (2013.01); *H01L 2924/20104* (2013.01); *H01L 2924/20105* (2013.01)

(56) References Cited

U.S. PATENT DOCUMENTS

| | | | | |
|---|---|---|---|---|
| 6,372,625 | B1* | 4/2002 | Shigeno et al. | 438/617 |
| 2003/0230809 | A1* | 12/2003 | Nakajima | H01L 23/5226 257/758 |
| 2007/0167000 | A1* | 7/2007 | Wood et al. | 438/629 |
| 2008/0029860 | A1* | 2/2008 | Gao | 257/675 |
| 2008/0073786 | A1* | 3/2008 | Tanabe et al. | 257/741 |
| 2010/0133677 | A1* | 6/2010 | Murayama | H01L 21/568 257/686 |
| 2010/0309641 | A1* | 12/2010 | Hata | H01L 21/563 361/783 |
| 2010/0311234 | A1* | 12/2010 | Tabira | 438/617 |
| 2011/0037158 | A1* | 2/2011 | Youn et al. | 257/686 |

FOREIGN PATENT DOCUMENTS

| | | |
|---|---|---|
| JP | H02-303038 | 12/1990 |
| JP | H0590355 | 4/1993 |
| JP | H09326423 | 12/1997 |
| JP | 1017099 | 7/2000 |
| JP | 2000200802 | 7/2000 |
| JP | 2001135668 | 5/2001 |
| JP | 2003-007756 | 1/2003 |
| JP | 2004207292 | 7/2004 |
| JP | 2005-123388 | 5/2005 |
| JP | 2006013062 | 12/2006 |
| JP | 2008515203 | 5/2008 |
| JP | 2009158738 | 7/2009 |
| KR | 0182503 | 4/1999 |

OTHER PUBLICATIONS

International Search Report and Written Opinion dated Feb. 16, 2012 in International Patent Application No. PCT/CN2011/074234.
Qin et al., "Ultrasonic Wire Bonding Technology in High-power IGBT Module Assembly", High Power Converter Technology, 2011 No. 02, pp. 22-25, Apr. 5, 2011.
Office Action dated Feb. 3, 2015 in Japanese Patent Application No. 2014-510631.
English language Abstract for JPH02-303038 published Dec. 17, 1990.
English language Abstract for JP2003-007756 published Jan. 10, 2003.
English language Abstract for JP2005-123388 published May 12, 2005.
Office Action dated Mar. 12, 2015 in Korean Patent Application No. 10-2013-7033637.
English language Abstract for KR0182503 published Apr. 15, 1999.
Office Action dated Nov. 26, 2015 in Chinese Patent Application No. 201180044179.5.
Office Action dated Jul. 12, 2016 in Japanese Patent Application No. 2004-510631.
English language Abstract for JPH0590355 published Apr. 9, 1993.
English language Abstract for JPH09326423 published Dec. 16, 1997.
English language Abstract for JP2000200802 published Jul. 18, 2000.
English language Abstract for JP2009158738 published Jul. 16, 2009.
English language Abstract for JP2008515203 published May 8, 2008.
English language Abstract for JP2001135668 published May 18, 2001.
Office Action dated Jul. 29, 2016 in Chinese Patent Application No. 201180044179.5.
Response to Office Action filed Sep. 7, 2016 in European Patent Application No. 12161081.0.
Office Action dated Aug. 17, 2016 in Korean Patent Application No. 10-2015-7030173.
English Abstract for JP2006013062 published Dec. 1, 2006.
Office Action dated Apr. 29, 2016 in European Patent Application No. 12161081.0.
Response to Office Action field Apr. 11, 2016 in Chinese Patent Application No. 201180044179.5.
Office Action dated Feb. 15, 2017 in European Patent Application No. 12161081.0.
English language Abstract for JP2004207292 published Jul. 22, 2004.
Office Action dated Mar. 8, 2017 in Korean Patent Application No. 10-2016-7032045.

* cited by examiner

US 9,704,797 B2

WATERFALL WIRE BONDING

BACKGROUND OF THE INVENTION

Field

The present technology relates to fabrication of semiconductor devices.

Description of Related Art

Wire bonding is a primary method of electrically coupling two separate electronic components such as semiconductor die or a substrate during semiconductor device fabrication.

During a wire bonding process, a length of wire (typically gold or copper) is fed through a central cavity of a needle-like disposable tool called the capillary. The wire protrudes through a tip of the capillary, where a high-voltage electric charge is applied to the wire from a transducer associated with the capillary tip. The electric charge melts the wire at the tip and the wire forms into a ball owing to the surface tension of the molten metal. As the ball solidifies, the capillary is lowered to bonding surface and ultrasonic energy is applied by the transducer. The bonding surface can also be heated to facilitate bonding. The combined heat, pressure, and ultrasonic energy create a weld between the copper or gold ball and the bonding surface. The capillary is then pulled up and away from the bonding surface, as the wire is passed out through the capillary. The resulting bond is referred as a ball bond. The bonding surface may be a die bonding pad of a semiconductor die, a contact pad of a substrate, or even another previous formed ball bond structure.

The capillary carrying the wire then moves over to another bonding surface such as next die bonding pad of adjacent semiconductor die or a contact pad of substrate, and descends and crushes the wire by touching the bonding surface to make the wire bond again using heat, pressure and ultrasonic energy. The capillary then pays out a small length of wire and tears the wire from the bonding surface. The resulting bond is often referred as a wedge bond, or a stitch bond.

DETAILED DESCRIPTION

Embodiments will now be described with reference to FIGS. 1 through 6, which relate to a waterfall wire bonded structure and semiconductor devices with the waterfall wire bonded structure and a method of fabricating a semiconductor device with waterfall wire bonded structure. It is understood that the present technology may be embodied in many different forms and should not be construed as being limited to the embodiments set forth herein. Rather, these embodiments are provided so that this disclosure will be thorough and complete and will fully convey the present technology to those skilled in the art. Indeed, the present technology is intended to cover alternatives, modifications and equivalents of these embodiments, which are included within the scope and spirit of the invention as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top," "bottom," "upper," "lower," "vertical" and/or "horizontal" as may be used herein are for convenience and illustrative purposes only, and are not meant to limit the description of the present technology inasmuch as the referenced item can be exchanged in position.

Figure 1A:
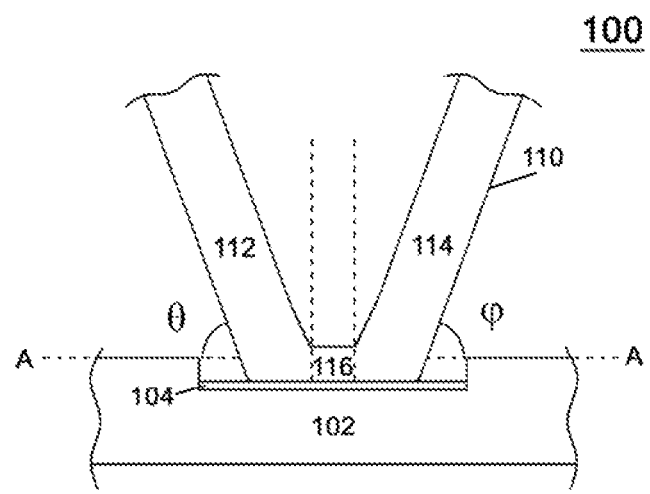
FIGS. 1A, 1B and 1C are a schematic side view, a schematic top view and a schematic perspective view of a wire bonded structure according to an embodiment of the present technology, respectively.
Figure 1B:
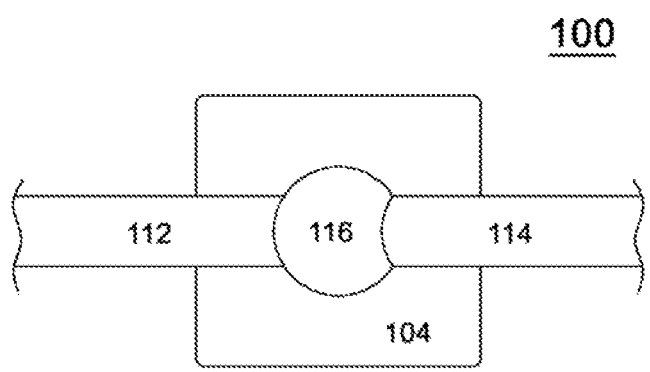
Figure 1C:
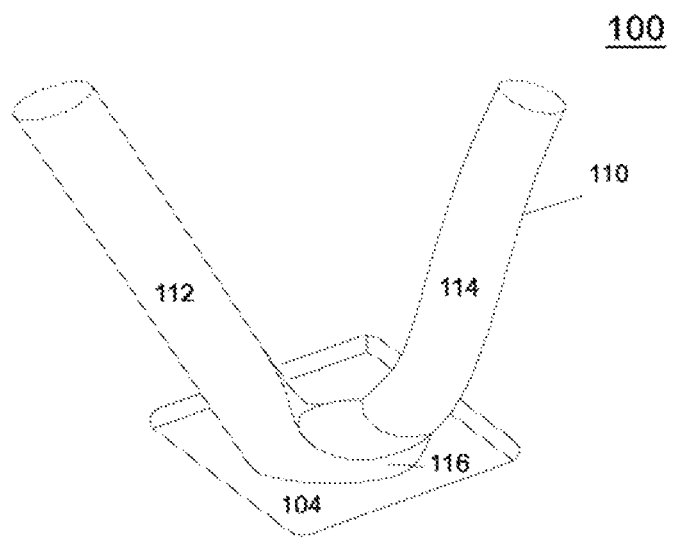

FIGS. 1A, 1B and 1C are a schematic side view, a schematic top view and a schematic perspective view of a wire bonded structure 100 according to an embodiment of the present technology, respectively. The wire bonded structure 100 includes a component 102 comprising a bonding pad 104 formed thereon and a continuous length of wire 110 bonded on top of the bonding pad 104.

The component 102 may be a semiconductor die or a substrate. Consequently, the bonding pad 104 may be a semiconductor die bonding pad on the semiconductor die or a contact pad on the substrate. The surface of the bonding pad 104 can be recessed into the component 102, as shown in FIG. 1A. Alternatively, the surface of the bonding pad 104 can be substantially coplanar with the surface of the component 102. The substrate may comprise printed circuit board (PCB), leadframe and Tape Automated Bonding (TAB) tape. The bonding pad 104 comprises gold or aluminum or gold-plated aluminum.

The continuous length of wire 110 may be divided into a first portion 112, a second portion 114 and a contact portion 116, as shown in FIG. 1A. The first portion 112 is used for connecting the bonding pad 104 with a first electrical contact (not shown) and the second portion 114 is used for connecting the bonding pad 104 with a second electrical contact (not shown). The first electrical contact and the second electrical contact can be a die bonding pad of an adjacent semiconductor die, contact pad of a substrate, or a previous formed bond structure. As shown in FIG. 1A, the first portion 112 and the second portion 114 of the wire 110 have a substantially circular cross-section with uniform diameter, which may be in a range from about 12.7 μm to about 38.1 μm. For example, the diameter of the first portion 112 and the second portion 114 of the wire 110 can be about 12.7 μm, about 15.2 μm, about 17.8 μm, about 20.3 μm, about 22.9 μm, about 25.4 μm, about 27.9 μm, about 30.5 μm, about 33.0 μm, about 35.6 μm, or about 35.6 μm. The contact portion 116 of the wire 110 between the first and second portion 112 and 114 is mutually diffused with the bonding pad 104, thus bonded on top of the bonding pad 104. The contact portion 116 has a flat shape with a substantially uniform thickness smaller than the diameter of the first and second portion 112 and 114. However, it is necessary to keep the thickness of the contact portion 116 of the wire 110 large enough in order to improve the bonding strength between the wire 110 and the bonding pad 104, and reduce the risks of defects such as cracking caused by stress concentration between the contact portion 116 and first and second portion 112 and 114. For example, the thickness of the contact portion 116 of the wire 110 is no less than 5 microns. The contact portion 116 may have a substantially circular shape on a reference plane A parallel to the surface of the bonding pad 104, which is a horizontal plane shown in FIG. 1A. The diameter of the contact portion 116 on the reference plane A depends on bonding pad opening (BPO) size of the bonding pad 104 and process parameters for forming the contact portion 116. In this case, the diameter of the contact portion 116 is in a range between about 1.2-2 times of the diameter of the first and second portion 112 and 114. Alternatively, the contact portion 116 also can have other geometries such as an ellipse shape on the reference plane A.

The first portion 112 of the wire 110 has an inclined angle θ of 30° to 70° relative to the reference plane A parallel to the bonding pad 104. The second portion 114 has an inclined angle φ of 45° to 90° relative to the reference plane A. In this case, the wire 110 is bent between the first portion 112 and the contact portion 116 as well as between the contact portion 116 and the second portion 114, respectively, as shown in the FIG. 1B. It can also be seen that the first portion 112 of the wire 110 and the second portion 114 of the wire 110 are aligned in the same direction, that is, the projection of the first portion 112 of the wire 110 on the reference plane A and the projection of the second portion 114 of the wire 110 on the reference plane A is along a straight line. Alternatively, the first portion 112 of the wire 110 and the second portion 114 of the wire 110 can be aligned in different directions. For example, the projection of the second portion 114 of the wire 110 on the reference plane A can have an inclination angle α of 45° or less relative to the projection of the first portion 112 of the wire 110 on the reference plane A.

The wire 110 may be gold wire, copper wire, palladium wire, palladium plated copper wire or silver based alloy wire. The wire 110 preferably includes the same material as the material for the bonding surface of the bonding pad, so that the bond strength between the wire 110 and the bonding pad 104 can be improved. For example, if the wire 110 is gold wire, the bonding pad 104 preferably is gold or gold-plated aluminum. Further details regarding the wire bonded structure 100 will be discussed with reference to a waterfall wire bonding process as described below.

Figure 2A:
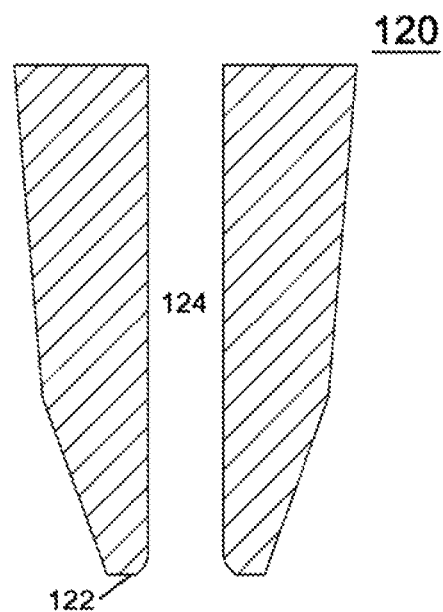
FIG. 2A is a schematic side view of a wire bonding device used in a waterfall wire bonding process according to an embodiment of the present technology.

FIGS. 2A-2E are schematic side views illustrating a waterfall wire bonding process for forming the wire bonded structure 100 shown in FIG. 1A according to an embodiment of the present technology. FIG. 2A shows a wire bonding device used in the waterfall wire bonding process known as a capillary 120. The capillary 120 has a needle-like shape and includes a profiled needle head 122 with a circular cross section shape for example and a central cavity 124 for feeding a continuous length of wire 110. The continuous length of wire 110 is fed through the capillary 120 during the waterfall wire bonding process. The capillary 120 can also comprise a transducer (not shown) to apply current and ultrasonic energy.

Figure 2B:
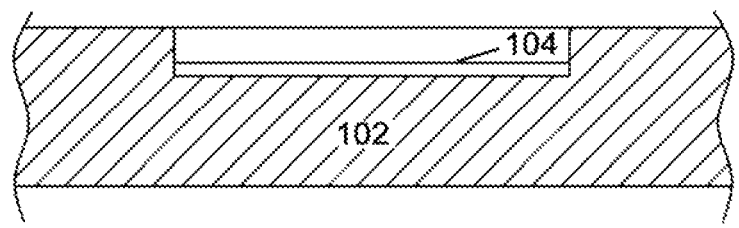
FIGS. 2B-2E are side views illustrating a continuous length of wire bonded on the bonding pad according to an embodiment of the present technology.

As shown in FIG. 2B, the bonding pad 104 is disposed on the component 102. This can be accomplished as following. The surface of the component 102 is masked and etched in order to form a recess defining position of the bonding pad 104. Then the conductive material such as gold or aluminum is deposited into the recess by a coating process, forming a bonding pad 104 with a top surface lower than the surface of the component 102 or substantially coplanar with the surface of the component 102.

Figure 2C:
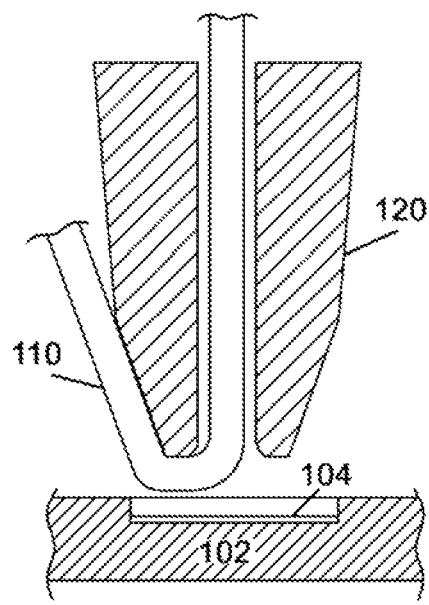

Next, as shown in FIG. 2C, the capillary 120 carrying a continuous length of wire 110 approaches the surface of the bonding pad 104 at a relatively large angle with reference to reference plane A compared with a wire bonding process in which the wire is bonded on an electrical bump disposed on the bonding pad. Thus, the first portion 112 of the wire 110 connecting with a previous first electrical contact (not shown) which is not deformed by the capillary 120, has a relative large angle θ with reference to the reference plane A parallel to the bonding pad 104. In case that the surface of the bonding pad 104 is lower than the surface of the component 102, such large approaching angle avoids contact between the wire 110 and the component 102 at upper corners of the recesses for forming the bonding pad 104. The angle θ of the first portion 102 relative to the bonding pad 102 is preferably about 30° to 70°.

Figure 2D:
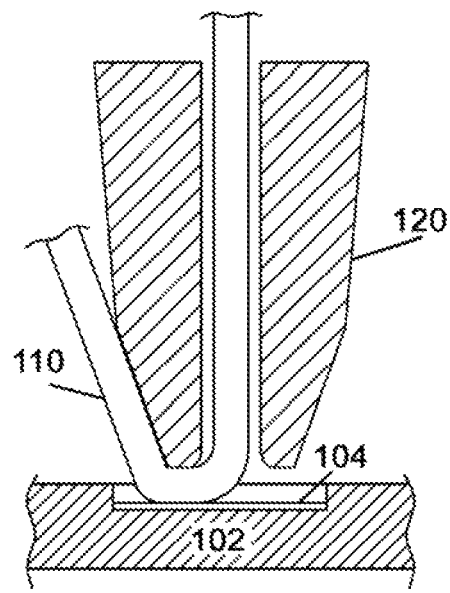

As shown in FIG. 2D, the capillary 120 is then further lowered and presses the wire 110 against the top surface of the bonding pad 104 with the profiled needle head 122 by applying a force and an ultrasonic energy at an elevated temperature.

The temperature of the wire bonding process is preferably in the range of about 140° C.-175° C., more preferably about 160° C. Due to such low processing temperature, the wire 110 such as gold wire, copper wire, palladium wire, palladium plated copper wire or silver based alloy all with melting temperatures over 1000° C. does not melt during the waterfall wire bonding process. Rather, the combination of the force, heat and ultrasonic energy deforms the wire 110, which forms an electrical and physical bond by mutual diffusion of materials in the contact portion 116 of the wire 110 and the surface of bonding pad 104. Consequently, the contact portion 116 has a substantially uniform thickness perpendicular to the bonding pad 104 smaller than the diameters of the first portion 112 and second portion 114 of the wire 110.

Due to the relatively large approaching angle of the wire 110 with respect to the bonding pad 104, the force applied by the profiled needle head 122 of the capillary 120 has a primary component in a direction perpendicular to the bonding pad 104. In this case, the effective force for facilitating the bonding can be increased, thus a smaller overall force can be employed for the waterfall wire bonding process, which in turn can avoid potential damage to the bonding pad 104, and reduce the risks of defects such as cratering or cracking on the bonding pad 104 caused by excessive force acted upon the bonding pad 104. The above issue might be otherwise significant since the wire 110 is bonded directly on the bonding pad 104 without the conductive bump disposed on the bonding pad 104 during the waterfall bonding process. The force is preferably in the range of about 15-35 gram-force, more preferably about 20 gram-force. In comparison, the force applied during a conventional bonding process can be over 40 gram-force. Furthermore, due to the large approaching angle, a contact portion 116 with a substantially circular shape on the reference plane A corresponding to the cross-sectional shape of the needle head 122 of the capillary 120 can be created, so that the stress induced by the capillary 120 can be distributed more uniformly across the bonding surface of the bonding pad 104. The diameter of the contact portion 116 on the reference plane A depends on bonding pad opening (BPO) size of the bonding pad 104 and process parameters for forming the contact portion 116, such as the force, ultrasonic energy etc. In this case, the diameter of the contact portion 116 is in a range between about 1.2-2 times of the diameter of the wire 110.

In addition, unlike the stitch bond process, the needle head 122 of the capillary 120 does not touch the surface of the bonding pad 104. Therefore, the wire 110 keeps continuity throughout the waterfall wire bonding process, that is, the wire 110 keeps a continuous shape without being broken or completely cut off by the force applied by the capillary 120 during the bonding process.

The ultrasonic energy applied by a transducer (not shown) of the capillary 120 is preferably in the range of 60-100 mW, more preferably about 80 mW. The ultrasonic energy is applied to improve mobility of the materials in the wire 110 and the bonding pad 104, so that a reliable bonding strength can be achieved even with a small bonding force and in the absence of the conductive bump in the waterfall wire bonding process.

It is understood that during the waterfall bonding process, the capillary 120 might move slightly slower compared with a conventional ball bonding or stitch bonding process. For example, the capillary 120 might move in a speed of 0.8 to 1 relative to the speed used in the conventional ball bonding or stitch bonding process. The bonding process might take about 80-200 milliseconds, preferably about 100 milliseconds for forming each wire bonded structure 100 in order to balance the throughput and reliability of the wire bonding process.

Figure 2E:
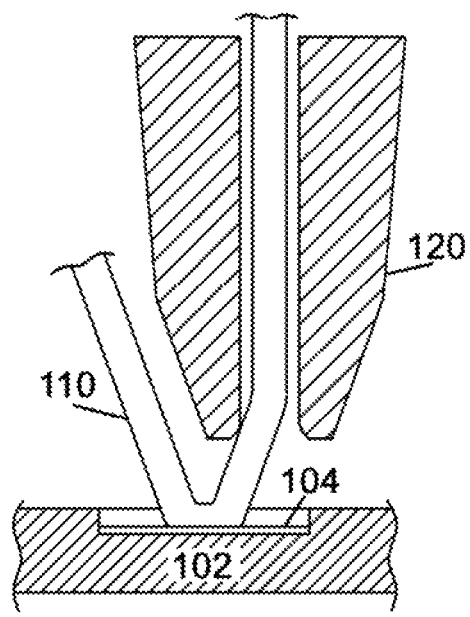

As shown in FIG. 2E, after the wire bonded structure 100 is formed, the capillary 120 moves away from the surface of the bonding pad 104 at a relative large angle, again avoiding the wire 110 from contacting with the corners of the recess in the component 102 for the bonding pad 104 as described above. In this case, the second portion 114 of the wire 110 connecting with the second electrical contact (not shown), which is also not deformed by the capillary has preferably an angle φ of about 45°-90° relative to the reference plane A parallel to the bonding pad 104.

The wire bonded structure and the waterfall wire bonding process according to the present technology as described above can be applied to various semiconductor devices for electrically coupling different components in the semiconductor devices. This will be further illustrated with examples hereafter.

Figure 3:
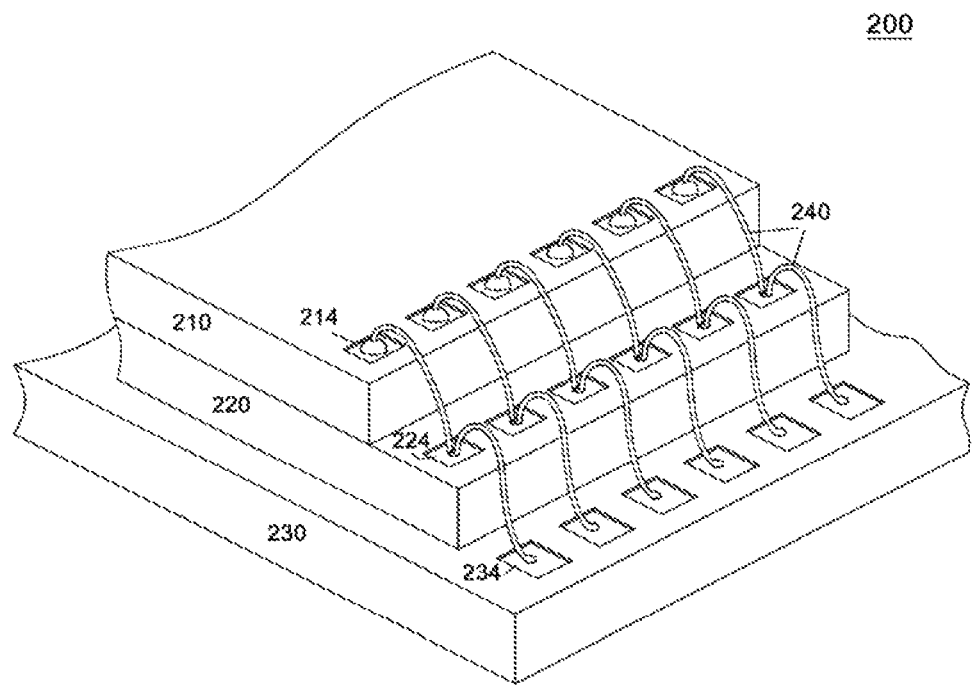
FIG. 3 is a perspective view illustrating a semiconductor device including two semiconductor dies and a substrate electrically coupled with the waterfall wire bonding according to an embodiment of the present technology.

FIG. 3 is a perspective view illustrating a semiconductor device 200 including two semiconductor dies and a substrate electrically coupled with the waterfall wire bonding process according to the present technology. As shown in FIG. 3, the semiconductor device 200 comprises a first semiconductor die 210 and a second semiconductor die 220 and a substrate 230. The first semiconductor die 210 comprises a plurality of first die bonding pads 214, the second semiconductor 220 comprises a plurality of second die bonding pads 224 and the substrate 230 comprises a plurality of contact pads 234. The first semiconductor die 210, the second semiconductor die 220 and the substrate 230 are stacked sequentially in an offset configuration so that the first die bonding pads 214 of the first semiconductor die 210, the second die bonding pads 224 of the second semiconductor die 220 and the contact pads 234 of the substrate 230 are exposed. The second semiconductor die 220 is electrically coupled to the first semiconductor die 210 and the substrate 230 by the waterfall wire bonding process according to the present technology. A wire bonded structure as shown in FIG. 1A to 1C is formed on each second die bonding pad 224, so that a continuous length of wire 240 can be cascaded down from the first semiconductor die 210 like a waterfall and mutually diffused with the bonding pads 224 and connecting a corresponding first die bonding pad 214, second die bonding pad 224 and contact pad 234. Therefore, the bonding process is named as "waterfall wire bonding". It is understood that there may be many more bonding pads 214, 224, contact pads 234 and bond wires 240 than those shown in FIG. 3.

Further details regarding the semiconductor device 200 will be discussed with reference to a waterfall wire bonding process for electrically coupling the semiconductor device 200 shown in FIGS. 4A-4E.

Figure 4A:
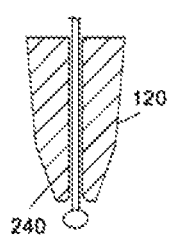
FIGS. 4A-4E are side views illustrating a waterfall wire bonding process for electrically coupling the semiconductor device shown in FIG. 3 according to an embodiment of the present technology.
Figure 4A:
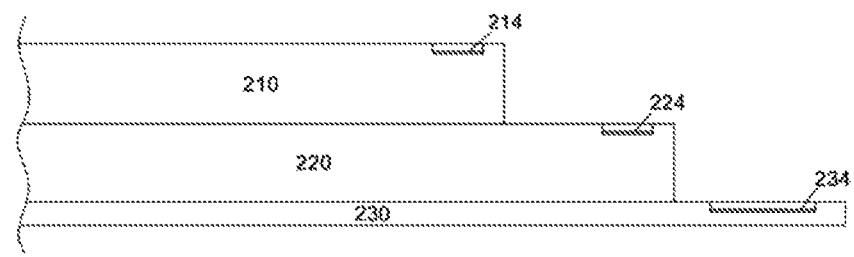

First, a ball made of material of bonding wire such as gold wire, copper wire, palladium wire, palladium plated copper wire or silver based alloy wire is formed at the tip of the capillary 120 located at a reference position of the wire bonding apparatus, as illustrated in FIG. 4A.

Figure 4B:
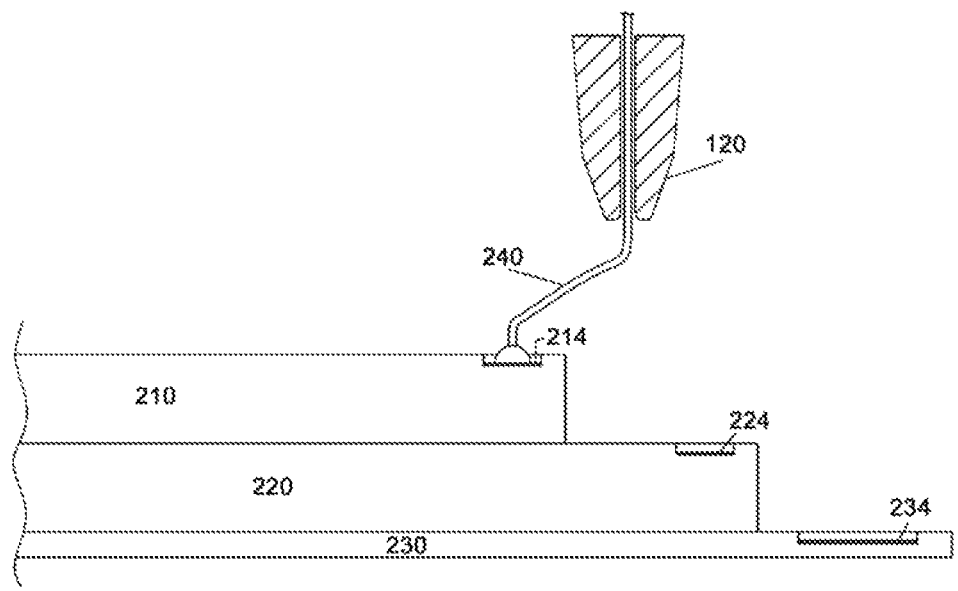

Next, as shown in FIG. 4B, the capillary 120 moves over to the first die bonding pad 214 of the first semiconductor die 210 and performs a ball bond. In particular, the capillary 120 descends and presses the ball against the first die bonding pad 214, meanwhile ultrasonic energy is applied by the transducer of the capillary 120. The first die bonding pad 214 is also heated to facilitate bonding. The combined heat, pressure, and ultrasonic energy bonds the ball and the first die bonding pad 214. The capillary 120 is then pulled up and away from the first die bonding pad 214, as a wire 240 is passed out through the capillary 120.

Figure 4C:
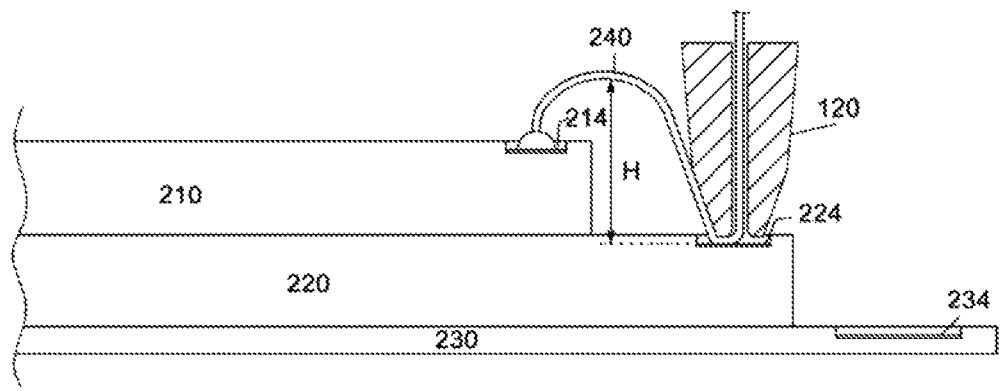

As shown in FIG. 4C, the capillary 120 moves over to the second die bonding pad 224 and performs a waterfall wire bonding process as previously described. Due to the large approaching angle of the waterfall wire bonding process, the loop height H of the wire 240, that is, the vertical distance between the bonding pad 224 and highest point of the curved wire 240 is no less than 75 microns given the thickness of the semiconductor die of 1-6 microns. It is necessary that the curved wire 240 at least has a clearance from the semiconductor die 210 larger than the diameter of the wire 240 in order to reduce the risk of the wire 240 contacting the die 210.

Figure 4D:
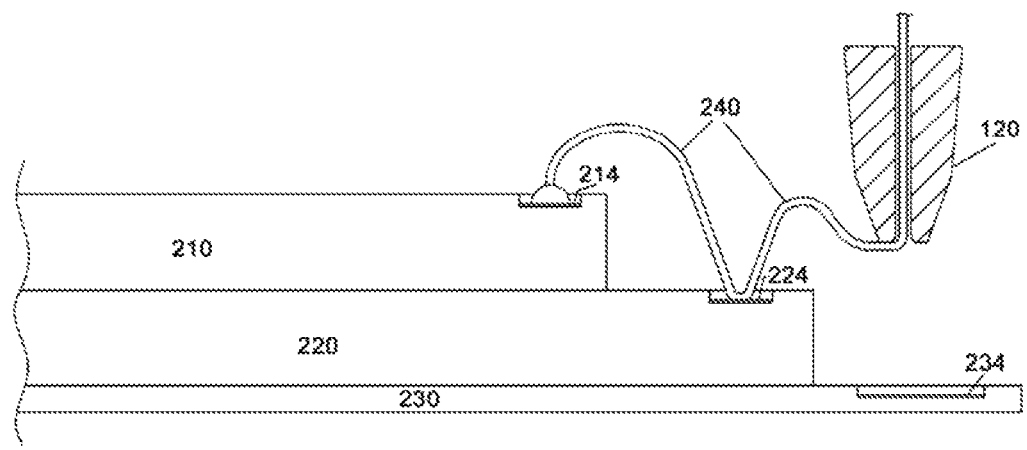
Figure 4E:
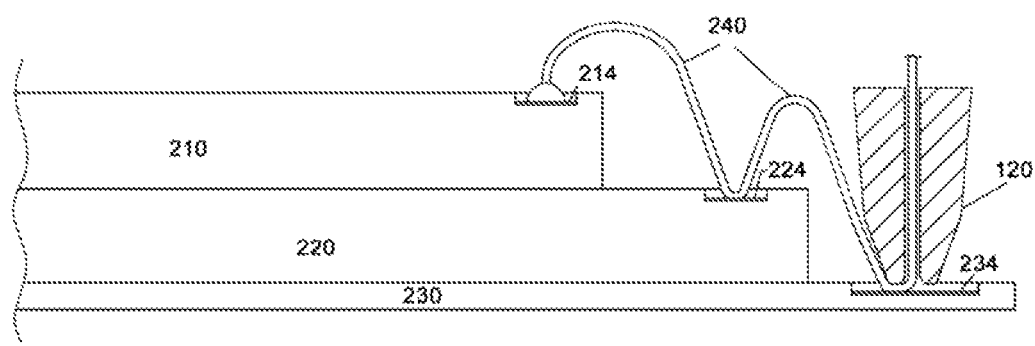

Next, as shown in FIG. 4D, the capillary 120 continuously pays out the wire 240 and moves over to the contact pad 234 of the substrate 230. Then, the capillary 120 bonds the wire 240 directly on the contact pad 234 by way of stitch bond, as shown in FIG. 4E.

After electrically connecting die bonding pads and contact pad in a row by the waterfall wire bonding as discussed above, the capillary 120 can perform the waterfall bonding for the die bonding pads and contact pad in an adjacent row in the same way cascading down from the top semiconductor die 210 to the substrate 230. The above-described waterfall wire bonding process can be repeated for all die bonding pads of the semiconductor dies 210 and 220 and contact pads of the substrate 230 in the semiconductor device 200 as shown in the perspective view of FIG. 3.

Alternatively, the capillary 120 can perform the waterfall bonding for the die bonding pads and contact pad in the adjacent row in a reverse direction starting from the bottom substrate 230 to the top semiconductor die 210. In addition, it is understood that the waterfall wire bonding process according to the present technology may also be applied reversely to form wire bonds sequentially from the lower substrate to the upper semiconductor dies for all contact pads and die bonding pads. The bonding sequence of the adjacent rows of the bonding pads of the semiconductor dies can also be adjusted depending on particular configuration. It can be seen that during electrically coupling the die bonding pads and contact pad in a row, the wire 240 is not cut until the wire 240 bonds the last component such as contact pad on the substrate or the die bonding pad on the top semiconductor die in the bonding sequence.

Figure 5:
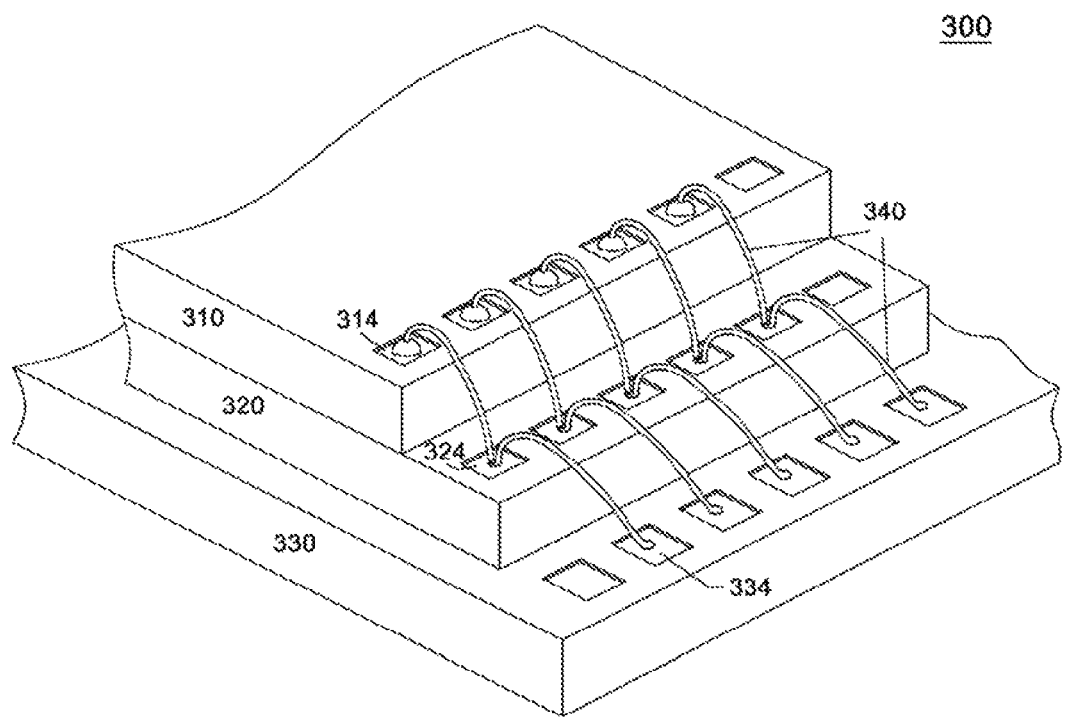
FIG. 5 is a perspective view illustrating a semiconductor device including two semiconductor dies and a substrate electrically coupled with the waterfall wire bond according to another embodiment of the present technology.

Although the wire 240 in the semiconductor device 200 shown in FIG. 3 is along a straight line during the above-described waterfall wire bonding process, the wire can also change direction from one bonding structure to another during waterfall wire bonding. FIG. 5 is a perspective view illustrating a semiconductor device 300 including two semiconductor dies 310, 320 and a substrate 330 electrically coupled with the waterfall wire bonding process according to the present technology. As shown in FIG. 5, a continuous length of wire 340 connects first bonding pad 314 from the left of the first semiconductor die 310 to first bonding pad 324 from the left of the second semiconductor die 320, then change direction by connecting said first bonding pad 324 from the left of the second semiconductor die 320 to a second contact pad 334 from the left of the substrate 330. The capability of changing direction during waterfall bonding process can provide flexibility in the wire layout design.

Figure 6:
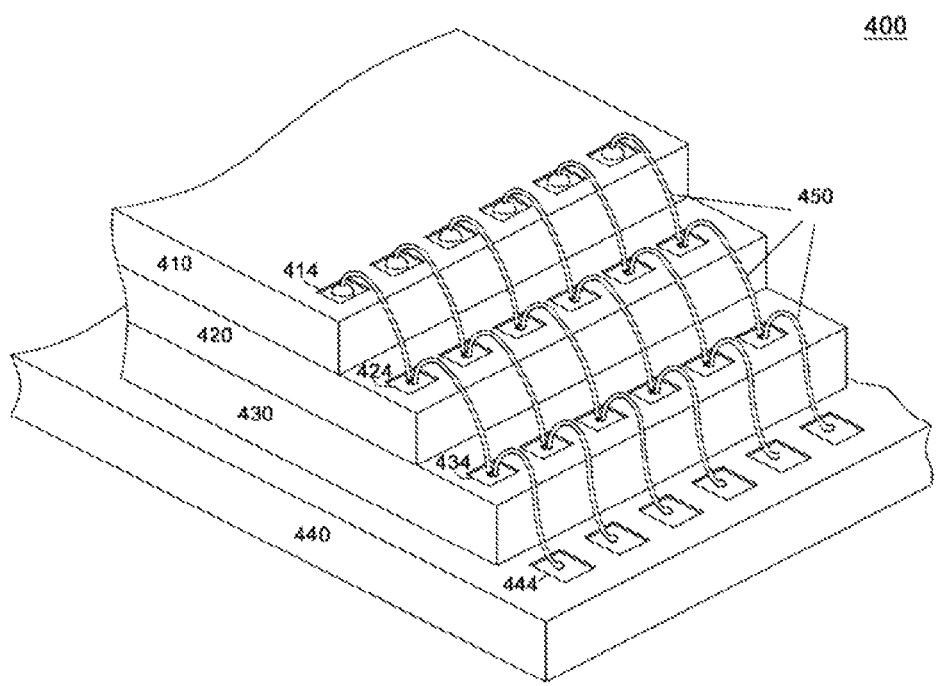
FIG. 6 is a perspective view illustrating a semiconductor device including three semiconductor dies and a substrate electrically coupled with the waterfall wire bond according to another embodiment of the present technology.

The above-described waterfall wire bonding process can also be applied to a semiconductor device including more than two semiconductor dies. For example, FIG. 6 shows a perspective view illustrating a semiconductor device 400 with three semiconductor dies 410, 420 and 430 and a substrate 440 electrically coupled with the waterfall wire bonding process according to the present technology. As shown in FIG. 6, continuous wires 450 are bonded onto the second die bonding pads 424 of the second semiconductor die 420 and the third bonding pads 434 of the third semiconductor die 430, respectively. It is understood that the semiconductor device may include other numbers of semiconductor dies.

Electrically coupling a semiconductor device with multiple semiconductor dies using the waterfall wire bond according to the present technology requires fewer steps and less fabrication time compared with wire bonding process using conventional ball bond and stitch bond. For example, in conventional wire bonding process using ball bond or stitch bond, the capillary cuts the wire and moves back to a reference point each time after performing the wire bonding. By contrast, in the waterfall wire bond, the capillary make consecutive wire bonds continuously with a continuous length of wire without cutting the wire and moving the capillary back and forth from and to the reference position of the wire bonding apparatus. Thus, it saves fabrication time by reducing capillary movements. Moreover, during the waterfall wire bonding, there is no conductive bump disposed on the bonding pad, therefore saving cost and fabrication time. For example, UPH (units per hour) can be improved by 22%-40%, 40%-55%, 52%-61% and 59%-64% for semiconductor devices with a 2-die stack, 4-die stack, 8-die stack and 16-die stack, respectively.

In embodiments described above, a wire bond is made between corresponding die bonding pads on respective semiconductor dies. As used herein, "corresponding" die bonding pads on different semiconductor dies refer to die bonding pads on different semiconductor dies that are aligned with each other along an edge of the dies including the die bonding pads. Thus, from the perspective view of FIG. 6, the first (leftmost) die pad on each of dies 410, 420 and 430 correspond with each other and are wire bonded together, the second die pad from the left on each of semiconductor dies 410, 420 and 430 correspond with each other and are wire bonded together, etc. However, in further embodiments, the above-described waterfall wire bond steps may be performed between diagonally oriented die bonding pads on respective die. For example, in FIG. 6, the leftmost die bonding pad of die 410 may be wire bonded in accordance with the above steps to the second die pad from the left on die 420. In addition, the bonding wire is not necessarily along the same direction during the waterfall wire bonding process, but can change direction such as by following a zigzag course.

Moreover, while embodiments described above show wire bonding between adjacent dies, it is understood that the present technology may be used to form a wire bond between die bonding pads on dies which are not adjacent to each other. Such wire bonds may be formed between corresponding die bonding pads on non-adjacent dies, or between diagonal die bonding pads on non-adjacent dies.

In one aspect, the present technology relates to a wire bonded structure for a semiconductor device. The wire bonded structure comprises a bonding pad; and a continuous length of wire mutually diffused with the bonding pad, the wire electrically coupling the bonding pad with a first electrical contact and a second electrical contact different from the first electrical contact.

In embodiments, the continuous length of wire has a first portion for electrically coupling the bonding pad with the first electrical contact, a contact portion contacting the bonding pad and mutually diffused with the bonding pad, and a second portion for electrically coupling the bonding pad with the second electrical contact. The contact portion of the wire has a flat shape with a substantially uniform thickness and the first and second portion of the wire have a line shape with a diameter larger than the thickness of the contact portion.

In embodiments, the diameter of the first portion and second portion of the wire is in a range from about 12.7 μm to about 38.1 μm. The thickness of the contact portion of the wire is no less than 5 microns. The first portion of the wire has an angle of about 30° to 70° relative to a reference plane parallel to the bonding pad and the second portion of the wire has an angle of about 45° to 90° relative to the reference plane. The projection of the first portion of the wire on the reference plane and projection of the second portion of the wire on the reference plane is not along a straight line. The contact portion of the wire has a substantially circular cross section shape in the reference plane.

In embodiments, the bonding pad comprises gold or aluminum. The wire comprises gold wire, copper wire, palladium wire, palladium plated copper wire or silver based alloy wire. The first and second electrical contact comprise die bonding pad, contact pad, conductive bump or bonding wire.

In another aspect, the present technology relates to a semiconductor device. The device comprises a first semiconductor die including a first die bonding pad; a second semiconductor die including a second die bonding pad, the second semiconductor die affixing to the first semiconductor die; a component including an electrical contact, the second semiconductor die affixing to the component; and a continuous length of wire mutually diffused with the second die bonding pad, the wire electrically coupling the second die bonding pad of the second semiconductor die with the first die bonding pad of the first semiconductor die and the electrical contact of the component.

In embodiments, the component can be a substrate and the electrical contact is a contact pad. The substrate comprises printed circuit board (PCB), leadframe and Tape Automated Bonding (TAB) tape. Alternatively, the component can be a third semiconductor die and the electrical contact is a third die bonding pad. The continuous length of wire is mutually diffused with the third die bonding pad. The continuous length of wire has a first portion for electrically coupling the second die bonding pad with the first die bonding pad, a contact portion contacting the second die bonding pad and mutually diffused with the second bonding pad, and a second portion for electrically coupling the second die bonding pad with the electrical contact. The contact portion of the wire has a flat shape with a substantially uniform thickness and the first and second portion of the wire have a line shape with a diameter larger than the thickness of the contact portion.

In embodiments, the diameter of the first portion and second portion of the wire is in a range from about 12.7 μm to about 38.1 μm. The thickness of the contact portion of the wire is no less than 5 microns. The first portion of the wire has an angle of about 30° to 70° relative to a reference plane parallel to the second bonding pad and the second portion of the wire has an angle of about 45° to 90° relative to the reference plane. The projection of the first portion of the wire on the reference plane and projection of the second portion of the wire on the reference plane is not along a straight line. The contact portion of the wire has a substantially circular cross section shape in the reference plane.

In yet another aspect, the present technology relates to a method of forming a wire bonded structure on a bonding pad of a semiconductor device. The method comprises: pressing a continuous length of wire against a top surface of bonding pad with a force applied by a wire bonding device comprising a central cavity feeding the wire; and mutually diffusing the continuous length of wire with the top surface of the bonding pad at an elevated temperature to thereby electrically couple the bonding pad with a first electrical contact and a second electrical contact different from the first electrical contact.

In embodiments, the force is about 15-35 gram-force. The temperature is about 140-175° C. During said step of mutually diffusing the continuous length of wire with the top surface of the bonding pad, an ultrasonic energy with a power of about 60-100 mW is applied. Said step of mutually diffusing the continuous length of wire with the top surface of the bonding pad takes about 80-200 milliseconds. During said step of pressing a continuous length of wire against a top surface of bonding pad, the wire bonding device does not touch the top surface of the bonding pad.

In yet another aspect, the present technology relates to a method of fabricating a semiconductor device. The method comprises the steps of: affixing a group of semiconductor dies to a substrate, the group of semiconductor dies including a top semiconductor die and one or more intermediate semiconductor dies between the top semiconductor die and the substrate, each semiconductor die in the group of semiconductor die including a die bonding pad, and the substrate including a contact pad; and electrically coupling the die bonding pad of the top semiconductor die to the top surfaces of the die bonding pads of the one or more intermediate semiconductor dies and to the contact pad of the substrate by pressing a continuous length of wire against top surface of bonding pads of the one or more intermediate semiconductor dies with a force applied by a wire bonding device comprising a central cavity feeding the wire and mutually diffusing the continuous length of wire on the top surfaces of the die bonding pad at an elevated temperature sequentially.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a first semiconductor die including a first die bonding pad;
   a second semiconductor die including a second die bonding pad, the first semiconductor die affixing to the second semiconductor die;
   a component including an electrical contact, the second semiconductor die affixing to the component; and
   a continuous length of wire, comprising:
     a first portion in between the first die bonding pad and the second die bonding pad,
     a mutually diffused portion mutually diffused with the second die bonding pad, and
     a second portion in between the second die bonding pad and the electrical contact, the mutually diffused portion of the continuous length of wire having a thickness in a direction perpendicular to a surface of the second die bonding pad that is smaller than a diameter of the first portion and the second portion, the continuous length of wire electrically coupling the second die bonding pad of the second semiconductor die with the first die bonding pad of the first semiconductor die and the electrical contact of the component.

2. The semiconductor device of claim 1, wherein the diameter of the first portion and second portion of the wire is in a range from about 12.7 μm to about 38.1 μm.

3. The semiconductor device of claim 2, wherein the thickness of the mutually diffused portion of the wire is no less than 5 microns.

4. The semiconductor device of claim 1, wherein the first portion of the wire has an angle of about 30° to 70° relative to a reference plane parallel to the second die bonding pad and the second portion of the wire has an angle of about 45° to 90° relative to the reference plane.

5. The semiconductor device of claim 4, wherein projection of the first portion of the wire on the reference plane and projection of the second portion of the wire on the reference plane is not along a straight line.

6. The semiconductor device of claim 4, wherein the mutually diffused portion of the wire has a substantially circular shape in the reference plane.

7. The semiconductor device of claim 1, wherein the second die bonding pad comprises gold or aluminum.

8. The semiconductor device of claim 1, wherein the wire comprises gold wire, copper wire, palladium wire, palladium plated copper wire or silver based alloy wire.

9. The semiconductor device of claim 1, wherein the component is a substrate and the electrical contact is a contact pad.

10. The semiconductor device of claim 9, wherein the substrate comprises printed circuit board (PCB), leadframe and Tape Automated Bonding (TAB) tape.

11. The semiconductor device of claim 1, wherein the component is a third semiconductor die and the electrical contact is a third die bonding pad.

* * * * *